(12) United States Patent  
Cauffiel et al.

(10) Patent No.: US 9,590,128 B2  
(45) Date of Patent: Mar. 7, 2017

(54) PARTICLE DETECTOR AND METHOD OF DETECTING PARTICLES

(71) Applicant: Lithium Innovations Company, LLC, Toledo, OH (US)

(72) Inventors: Ford B. Cauffiel, Holland, OH (US); Alvin D. Compaan, Holland, OH (US); Victor V. Plotnikov, Toledo, OH (US); Paul G. Chamberlin, Toledo, OH (US); John M. Stayancho, Marblehead, OH (US); Ambalanath Shan, Toledo, OH (US)

(73) Assignee: LITHIUM INNOVATIONS COMPANY, LLC, Toledo, OH (US)

( * ) Notice: Subject to any disclaimer, the term of this patent is extended or adjusted under 35 U.S.C. 154(b) by 0 days.

(21) Appl. No.: 14/679,412

(22) Filed: Apr. 6, 2015

(65) Prior Publication Data

US 2015/0287872 A1    Oct. 8, 2015

Related U.S. Application Data

(60) Provisional application No. 61/995,216, filed on Apr. 7, 2014, provisional application No. 62/066,751, filed on Oct. 21, 2014.

(51) Int. Cl.  
*H01L 31/115* (2006.01)  
*G01T 3/08* (2006.01)

(52) U.S. Cl.  
CPC .............. *H01L 31/115* (2013.01); *G01T 3/08* (2013.01)

(58) Field of Classification Search  
CPC .... G01T 3/08; G01T 1/24; G01T 3/00; H01L 31/115; H01L 31/022408  
See application file for complete search history.

(56) References Cited

U.S. PATENT DOCUMENTS

| | | | |
|---|---|---|---|
| 5,117,114 A * | 5/1992 | Street et al. ............. | 250/370.11 |
| 5,940,460 A | 8/1999 | Seidel et al. | |
| 8,022,369 B2 | 9/2011 | Orava et al. | |
| 8,569,708 B2 | 10/2013 | Stradins et al. | |
| 9,029,792 B2 | 5/2015 | Stradins et al. | |
| 2005/0258372 A1* | 11/2005 | McGregor et al. ...... | 250/390.01 |
| 2009/0302226 A1* | 12/2009 | Schieber et al. ......... | 250/370.02 |
| 2011/0163242 A1* | 7/2011 | Mao et al. ................ | 250/390.01 |
| 2013/0015363 A1 | 1/2013 | Orava et al. | |
| 2013/0292685 A1* | 11/2013 | Jiang .................. | H01L 31/0304 257/76 |

OTHER PUBLICATIONS

D.S. McGregor, et al; Present status of microstructured semiconductor neutron detectors; Journal of Crystal Growth; Feb. 21, 2013, pp. 99-110; 379.

(Continued)

*Primary Examiner* — Marcus Taningco  
(74) *Attorney, Agent, or Firm* — Marshall & Melhorn, LLC

(57) ABSTRACT

A particle detector having a support member. A front electrode layer is disposed over the support member. A semiconductor junction having at least an n-type layer and at least a p-type layer is disposed over the front electrode layer. A back electrode layer is disposed over the semiconductor junction. The back electrode layer has a thickness which is selected to permit particles having energies in the range from about 0.5 MeV to about 5 MeV to enter the semiconductor junction.

25 Claims, 8 Drawing Sheets

(56) References Cited

OTHER PUBLICATIONS

Andrew Inglis, et al; Glass-Panel $^6$Li Neutron Detector; 2012 IEEE Conference on Technologies for Homeland Security; 2012, pp. 429-434.
R. Dahal, et al; Self-powered micro-structured solid state neutron detector with very low leakage current and high efficiency; Applied Physics Letters; Jun. 15, 2012, pp. 243507-1 to 243507-4; 100.
Richard T. Kouzes, et al; Alternatives to the $^3$He for Neutron Detection for Homeland Security; Pacific Northwest National Laboratory Report; 2009; PNNL Report-18471; Richland, Washington.
Richard T. Kouzes, et al; Passive neutron detection for interdiction of nuclear material at borders; Nuclear Instruments and Methods in Physics Research A 584; 2008; pp. 383-400.
D.S. McGregor, et al; Design considerations for thin film coated semiconductor thermal neutron detectors—I: basics regarding alpha particle emitting neutron reactive films; Nuclear Instruments and Methods in Physics Research A 500; 2003; pp. 272-308.
D.S. McGregor, et al; Semi-insulating bulk GaAs as a semiconductor thermal-neutron imaging device; Nuclear Instruments and Method in Physics Research A 380; 1996; pp. 271-275.
Troy C. Unruh, et al.; Design and operation of a 2-D thin-film semiconductor neutron detector array for use as a beamport monitor; Nuclear Instruments and Methods in Physics Research A; 2009.01.087.
D.S. McGregor, et al.; Thermal neutron detection with cadmium zinc$_x$ telluride semiconductor detectors; Nuclear Instruments and Methods in Physics Research A 381; 1996$^{l-x}$; pp. 498-501.
D.S. McGregor, et al; Room-temperature compound semiconductor radiation detectors; Nuclear instruments and Methods in Physics Research A 395; 1997; pp. 101-124.
Douglas S. McGregor, et al; Present status of microstructured semiconductor neutron detectors; Journal of Crystal Growth; 2013; pp. 99-110; 379.

B.D. Milbrath, et al; Radiation detector materials: An overview; Journal of Materials Research; Oct. 2008; pp. 2561-2581; vol. 23.
R.T. Kouzes, et al; Neutron Detector Gamma Insensitivity Criteria; Pacific Northwest National Laboratory; Oct. 28, 2009; PNNL-18903; Richland, Washington.
Kyle A. Nelson, et al; Investigation of a lithium foil multi-wire proportional counter for potential $^3$He replacement; Nuclear Instruments and Method in Physics Research A 669; 2012; pp. 79-84.
Kyle A. Nelson, et al; Characterization of a mid-sized Li foil multi-wire proportional counter neutron detector; Nuclear Instruments and Methods in Physics Research A 762; 2014; pp. 119-124.
Dr. Yaron Danon; Development of a Self Biased High Efficiency Solid-State Neutron Detector for MPACT Applications; Nuclear Energy University Programs (NEUP), U.S. Department of Energy, Project No. 10-852; 2013.
E. Rossa, et al; New Development of a Radiation-Hard Polycrystalline CdTe Detector for LHC Luminosity Monitoring. Proceedings DIPAC 2001; CT11; pp. 94-96; ESRF, Grenoble, France.
Hugh E. Chung, Radiation Detection and Imaging: Neutrons and Electric Fields, Thesis, Aug. 2015, 142 Pages, Arizona State University, Arizona, USA.
John W. Murphy, Lindsey Smith, J. Calkins, Israel Mejia, Kurtis D. Cantley, Richard A. Chapman, Manuel A. Quevedo-Lopez and Bruce E. Gnade, Thin Film Cadmium Telluride Charged Particle Sensors for Large Area Neutron Detectors, Applied Physics Letters, Sep. 19, 2014, 5 Pages, Erik Jonsson School of Engineering and Computer Science, UT Dallas, Eugene McDermott Library, AIP Publishing LLC, USA.
Majety, S. et al: Metal-semiconductor-metal neutron detectors based on hexagonal boron nitride epitaxial layers; Published in SPIE Proceedings Hard X-Ray, Gamma-Ray, and Neutron Detector Physics XIV, vol. 8507, 85070R, Oct. 24, 2012; Downloaded From: http://proceedings.spiedigitallibrary.org/ on Oct. 30, 2012.

\* cited by examiner

PARTICLE DETECTOR AND METHOD OF DETECTING PARTICLES

CROSS-REFERENCE TO RELATED APPLICATION

This application is claiming the benefit, under 35 U.S. C. 119(e), of the provisional application which was granted Ser. No. 61/995,216 and filed on Apr. 7, 2014 and the provisional application which was granted Ser. No. 62/066,751 and filed on Oct. 21, 2014, the entire disclosures of which are hereby incorporated by reference.

BACKGROUND OF THE INVENTION

The invention relates to a particle detector. The invention also relates to a method of detecting particles.

Each year millions of freight containers are unloaded at almost 400 U.S. seaports. Additionally, there are nearly 1 million public and private airplane flights landing on U.S. soil and 11 M trucks and 2M rail cars that enter the U.S. from Canada and Mexico each year. Also, there are about 50 vehicle border crossings to the U.S. with typically 5-10 traffic lanes. Particle detectors such as, for example, neutron detectors are currently used at seaports, airports, rail yards, and border crossings to scan for contraband special nuclear material (SNM) and to prevent terrorists from smuggling said material, e.g., a fission bomb or fissionable material, into the U.S. Fissioning nuclei generally emit neutrons of many different energies but most of these neutrons rapidly lose energy and reach kinetic energies typical of the surrounding material. These "thermal" neutrons have kinetic energies approximately equal to a $k_BT$ of ~25 MeV where $k_B$ is the Boltzmann constant and T is room temperature. Detection of thermal neutrons is typically the most important. Scanning each freight container, airplane, truck, rail car and vehicle that enters the U.S. would require thousands of neutron detectors.

One of the most common large-area detectors for thermal neutrons employs He-3 isotopically enriched gas in a cylindrical tube proportional counter. Alternatively, a multiwire proportional counter (MWPC) may be used with He-3. However, there is a serious shortage of the He-3 isotope while the demand continues to rise for detectors of SNM at U.S. ports and in foreign locations. Except for gaseous He-3, which has a very large thermal neutron cross section and can also serve as the main component of a proportional counter, most neutron detectors need a separate neutron activation layer which includes a material that has a high concentration of an isotope with a large neutron cross-section. Such isotopes include He-3, Li-6, B-10, and Cd-113. These isotopes not only capture slow or thermal neutrons very well, but then emit high energy charged particles that are easier to detect.

One type of nuclear particle detector is based on gas discharge proportional counters or those operating in the Geiger discharge region and called Geiger tubes. For large-area detectors, these may take the form of a multiwire proportional detector or may use an array of tubular structures. If they are not filled with He-3 gas, they typically need a neutron activation material in addition to the gas for the proportional detector. These proportional counters typically operate at 1000 V or higher, are bulky, and are sensitive to pressure and temperature changes. Another common detector type is designed around a scintillator material, either solid or liquid, that emits bursts of light when a charged particle passes through it. This light is then detected by a photomultiplier or other photon detector. The scintillator light is usually emitted in the near UV or visible range of wavelengths. Scintillator detectors are also typically bulky, complex and can be very sensitive to gamma-ray background counts.

Yet another type of detector is based on a high purity, single crystal semiconductor together with one of the activating isotopes. In this case, the high-energy charged particles produced by the neutron activator material will directly generate a large number of electron-hole pairs in the semiconductor as the charged particle passes through the semiconductor. These electrons and holes are collected in the same semiconductor, usually by applying a strong external voltage to create an electric field in the semiconductor which separates the electrons and holes and sweeps them to the positive and negative electrodes. Unlike the scintillator crystal, particle detection occurs entirely in one detector structure. In most cases, the semiconductor material must be from 1 to 10 mm thick.

One frequent limitation of the semiconductor detector is that usually high-quality single crystals are needed in order to obtain a high probability of collection of the generated charge carriers. Due to the limited size available for most high quality single crystals, achieving large-area detection from single-crystal materials then requires assembling an array of smaller crystals or using an array of thinly sliced wafers of single crystals which significantly increases the costs. Additionally, effective use of the neutron activation material and the semiconductor often requires that the semiconductor be microstructured with pores or grooves to accommodate the neutron activator layers. A further limitation of this type of neutron detector is its sensitivity to radiation damage from radiation that pervades many environments in which the detector is to be used which degrades the performance of the detector over time. In addition, the large semiconductor volume leads to sensitivity to gamma-ray background noise.

Furthermore, the aforementioned particle detectors are typically bulky and difficult to use. If the footprint for and portability of a particle detector was improved, security at seaports, airports, rail yards, and border crossings would increase. Additionally, if such improvements to particle detectors were made, demand for the detectors in other applications and industries would increase. For example, demand for a particle detector with the capability to detect neutrons utilized in down-hole well-logging applications in the oil and gas industry would increase if the aforementioned improvements were made.

Thus, it would be desirable to provide a particle detector that addresses the deficiencies described above. It would also be desirable to provide a method of detecting energized charged particles which addresses the aforementioned deficiencies.

BRIEF SUMMARY OF THE INVENTION

Embodiments of a particle detector are provided.

In an embodiment, the particle detector comprises a support member. A front electrode layer is disposed over the support member. A semiconductor junction having at least an n-type layer and at least a p-type layer is disposed over the front electrode layer. A back electrode layer is disposed over the semiconductor junction. The back electrode layer has a thickness which is selected to permit particles having energies in the range from about 0.5 MeV to about 5 MeV to enter the semiconductor junction.

In another embodiment, the particle detector detects neutrons. In this embodiment, the particle detector comprises a first support member. A first front electrode layer is disposed over the first support member. A first semiconductor junction having at least an n-type layer and at least a p-type layer is disposed over the first front electrode layer. A first back electrode layer is disposed over the first semiconductor junction. A neutron activation layer is disposed over the first back electrode layer. A second back electrode layer is disposed over the neutron activation layer. A second semiconductor junction having at least an n-type layer and at least a p-type layer is disposed over the second back electrode layer. A second front electrode layer is disposed over the second semiconductor junction and a second support member is disposed over the second front electrode layer.

Embodiments of a method of detecting particles are also provided. In an embodiment, the method comprises providing a source of particles. A particle detector is provided adjacent the source of particles. The particle detector comprises a semiconductor junction, front electrode layer, and back electrode layer. The semiconductor junction is positioned between the front electrode layer and the back electrode layer and receives particles from the source of particles. Electron-hole pairs are formed in the semiconductor junction. The electron-hole pairs are separated utilizing an electric field provided by the semiconductor junction. Electrons of the electron-hole pairs are collected at the front electrode layer and holes of the electron-hole pairs are collected at the back electrode layer. A pulsed signal is produced which indicates that particles are in or have passed through the semiconductor junction.

BRIEF DESCRIPTION OF THE DRAWINGS

The above, as well as other advantages of the present invention will become readily apparent to those skilled in the art from the following detailed description when considered in the light of the accompanying drawings in which.

DETAILED DESCRIPTION OF THE INVENTION

Figure 1:
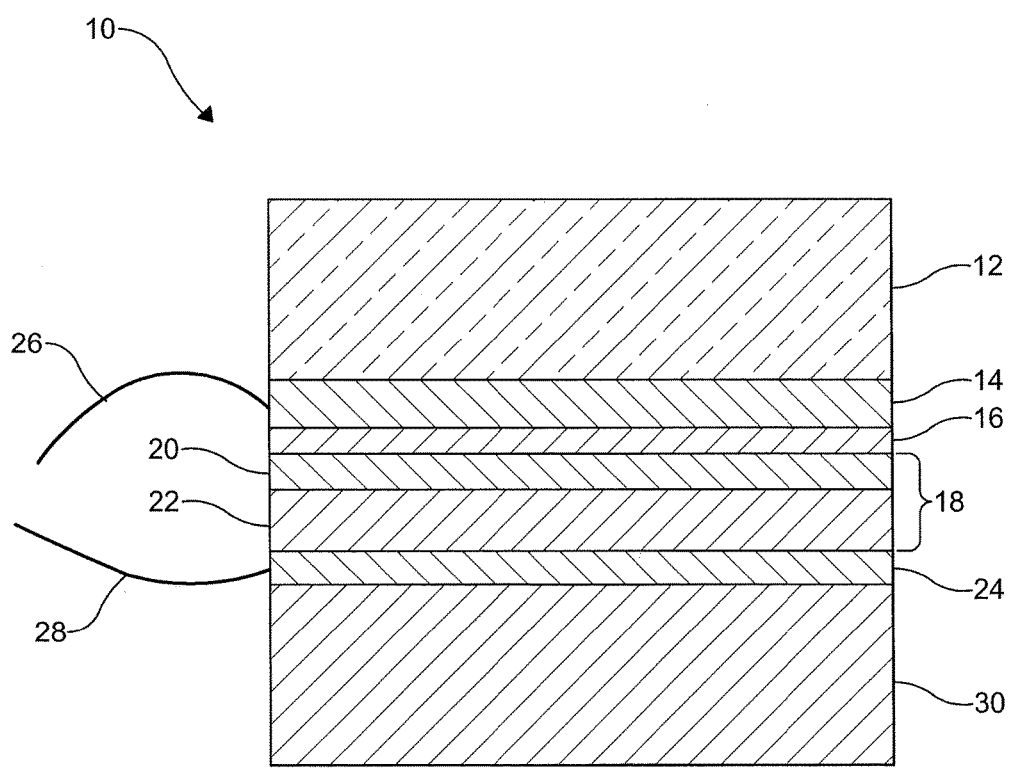
FIG. 1 is a cross-sectional view of an embodiment of a particle detector in accordance with the invention.

It is to be understood that the invention may assume various alternative orientations and step sequences, except where expressly specified to the contrary. It is also to be understood that the methods, assemblies and features illustrated in the attached drawings, and described in the following specification are simply exemplary embodiments of the inventive concepts. Hence, specific dimensions, directions, or other physical characteristics relating to the embodiments disclosed are not to be considered as limiting, unless expressly stated otherwise. Also, although they may not be, like elements in various embodiments described herein may be commonly referred to with like or similar reference numerals within this section of the application.

Referring now to the figures, embodiments of a particle detector 10, 100, 200, 300, 400 are described below. It would be understood by one of ordinary skill in the art that the particle detector 10, 100, 200, 300, 400 and method described herein have many applications including, but not limited to, applications for scanning freight and other types of containers. Furthermore, it would be understood by one of ordinary skill in the art that embodiments of the invention could have passenger vehicle, commercial vehicle, industrial, locomotive, naval and aerospace applications.

The particle detector 10, 100, 200, 300, 400 described herein is of the solid-state variety and overcomes the disadvantages of the known devices described above. For example, since the particle detector 10, 100, 200, 300, 400 is of the solid-state variety, no sealed gas chambers are utilized in the particle detector. Thus, the particle detector 10, 100, 200, 300, 400 is not susceptible to microphonics and will not be damaged by exposure to low pressure environments such as, for example, airplane compartments or during use in and/or transport through mountainous regions. Also, the particle detector 10, 100, 200, 300, 400 is not highly sensitive to gamma radiation. Further, the particle detector 10, 100, 200, 300, 400 may be of a rugged, durable configuration that is resistant to radiation damage. Additionally, the particle detector 10, 100, 200, 300, 400 can be formed from light-weight materials that are scalable for use as a large area detector and fabricated by low cost manufacturing methods. Other advantages found in certain embodiments of the particle detector 10, 100, 200, 300, 400 will be described below.

Referring now to FIG. 1, the particle detector 10 comprises a support member 12. The support member 12 may be provided as either a superstrate or substrate when forming certain portions of the particle detector 10. Preferably, the support member 12 is of a sufficient thickness and rigidity to provide mechanical support for those portions of the detector. In an embodiment, the thickness of the support member 12 is 3 millimeters (mm) or less. Preferably, the thickness of the support member 12 is 1 mm or less. More preferably, the thickness of the support member 12 is about 0.1 mm. Also, the support member provides mechanical support for the other portions of the detector, it may be flexible so that it can be formed into a desired shape. However, it is preferred that the support member 12 is of a thickness which is greater than the thickness of the other respective layers in the particle detector 10.

In certain embodiments, the support member 12 is comprised of a ceramic material such as glass. In these embodiments, it may be preferable to use glass having a silicate composition such as, for example, a borosilicate composition. A particularly preferred glass having a borosilicate composition and suitable for use as the support member is manufactured by Corning and sold under the trademark Willow™ glass. Alternatively, glass having a soda-lime-silica composition or another composition may be utilized. In another embodiment, the support member 12 is comprised of a polymer such as, for example, polyimide. In yet another embodiment, the support member 12 is metallic. In this embodiment, the support 12 member may comprise aluminum. In the aforementioned embodiments, the support 12 member is of a thickness from about 25 microns to about 3000 microns.

A front electrode layer 14 is provided over the support member 12. In an embodiment, the front electrode layer 14 is disposed directly on the support member 12. The front electrode layer 14 has a sheet resistance of 100 ohms per square (ohm/square) or less. Preferably, the front electrode layer 14 has a sheet resistance of between 5 and 100 ohm/square. More preferably, the front electrode layer 14 has a sheet resistance of between about 5 and 20 ohm/square. In certain embodiments, the front electrode layer 14 comprises a transparent conductive oxide (TCO). In these embodiments, the TCO may comprise ZnO:Al (AZO), $SnO_2$:F (FTO), $In_2O_3$:Sn (ITO), CdO, $Cd_2CdO_4$, or InZrO (IZO). In another embodiment, the front electrode layer 14 comprises ZnS.

A high resistivity buffer layer 16 may be provided over the front electrode layer 14 or a semiconductor junction 18. In an embodiment, the high resistivity buffer layer 16 is disposed directly on the front electrode layer 14. In another embodiment (not depicted), a high resistivity buffer layer is disposed directly on the semiconductor junction 18. Preferably, the high resistivity buffer layer 16 has a sheet resistance of 100 ohm/square or more. More preferably, the high resistivity buffer layer 16 has a sheet resistance of between about 1000 to 100,000 ohm/square. When the high resistivity buffer layer 16 is disposed directly on the front electrode layer 14, the high resistivity buffer layer 16 has a resistivity that is greater than the front electrode layer 14. Preferably, the resistivity of the high resistivity buffer layer 16 is about 1000 times greater than the resistivity of the front electrode layer 14. When the high resistivity buffer layer 16 is disposed directly on the semiconductor junction 18, the high resistivity buffer layer 16 has a resistivity that is greater than the semiconductor junction 18. In certain embodiments, the high resistivity buffer layer 16 comprises at least one of ZnO (ZO), $SnO_2$ (TO), ZnS, CdO, and $Zn_2CdO_4$.

The semiconductor junction 18 is disposed over the front electrode layer 14. In an embodiment, the semiconductor junction 18 is disposed over the front electrode layer 14 and directly on the high resistivity buffer layer 16. In another embodiment (not depicted), semiconductor junction is disposed directly on the front electrode layer.

The semiconductor junction 18 has at least an n-type layer 20 and at least a p-type layer 22. In an embodiment, semiconductor junction 18 comprises cadmium telluride (CdTe), copper indium gallium diselenide (CIGS), copper zinc tin selenide (CZTS) or is an organic such as polyphenylene vinylene (PPV) or another conjugated system. In another embodiment, the semiconductor junction 18 comprises a polycrystalline n-type layer and a polycrystalline p-type layer. In this embodiment, the semiconductor junction 18 may consist of the aforementioned polycrystalline layers. However, in another embodiment (not depicted), the semiconductor junction includes an i-type layer. In one such embodiment, the i-type layer is a nearly intrinsic semiconductor layer of CdTe that is not intentionally doped or has only a small amount of a p-type dopant. Preferably, the semiconductor junction 18 is a heterojunction where the polycrystalline n-type layer is CdS and the polycrystalline p-type layer is CdTe. In these embodiments, the semiconductor junction 18 may consist of polycrystalline layers of CdS and CdTe. However, in another embodiment (not depicted), the semiconductor junction may be a homojunction. In the aforementioned embodiments, the front electrode layer 14 serves as an emitter facilitating good electron transport out of the n-type layer 20 and a back electrode layer 24 provides hole transport out of the p-type layer 22. When a polycrystalline CdS/CdTe heterojuction is provided, it is preferable that the heterojuction is been exposed to a $CdCl_2$ treatment in the presence of oxygen ($O_2$) gas in the temperature range from about 330° C. to about 450° C. after forming the layers of CdS and CdTe.

In many applications of the particle detector 10, 100, 200, 300, 400 one only needs to record the event of a particle having entered or passing through the detector. However, when particles have entered or pass through the particle detector 10, 100, 200, 300, 400, the characteristics of the particles can be identified by the particle detector. The particle detector 10, 100, 200, 300, 400 can identify some characteristics of the particles by the energy loss rate of the particles that have entered or passed therethrough. The energy loss rate of a particle is determined by the charge and energy of the particle. The charge and energy of a particle can be determined by the particle detector 10, 100, 200, 300, 400 by appropriate selection of the thickness of the polycrystalline layers of CdS and CdTe. To determine the loss rate, it is desirable that a particle lose only a small fraction of its total kinetic energy while passing through the semiconductor junction. Preferably, the thickness of the polycrystalline layers of CdS and CdTe are selected to be very thin so that the energy of the particle(s) is constant as it passes through the heterojunction. In an embodiment, the thickness of the CdTe layer is 15 microns or less. Preferably, the thickness of the CdTe layer is 350 nanometers (nm) or less. More preferably, the thickness of the CdTe layer is 250 to 350 nm.

Utilizing a thin CdTe layer is advantageous because it allows gamma radiation to pass through the semiconductor junction 18 without being detected. For example, utilizing a CdTe layer having a thickness of 2 microns will provide a Compton scattering probability of only $7.0 \times 10^{-5}$ for a gamma ray of about 1 MeV. Such low scattering ensures that background gamma radiation detection is minimal. Furthermore after Compton scattering, the signal produced in the particle detector 10, 100, 200, 300, 400 will depend on how much energy that the Compton electron deposits in the CdTe layer before exiting. For example, a 0.1-3 MeV electron has a stopping power of less than 2 MeV-$cm^2$/g and for the density of CdTe (5.8 g/$cm^2$) this computes to an attenuation coefficient of $\mu$=11.6 MeV/cm. Thus, in a layer of CdTe having a thickness of 2 microns, the energy deposited by a Compton scattered electron generated by a gamma ray will be only 2.3 keV which will create about 460 electron-hole pairs. Utilizing a signal filter 34, a threshold can be selected to reject Compton scattered electrons generated by gamma radiation. After selecting the desired threshold to reject Compton scattered electrons generated by gamma radiation, only Compton electrons scattered moving in a direction parallel to the CdTe layer will create an electron-hole pair and a pulse large enough to be displayed. It should be appreciated that this will be a rare event.

Utilizing a polycrystalline CdS/CdTe heterojunction provides an electric field within the particle detector 10, 100, 200, 300, 400. The internal electric field is about 3,000 V/cm and extends across the semiconductor junction 18. When electron-hole pairs are generated, the electric field separates the pairs out of, for example, the CdTe layer so that charge collection can occur. Separating the electron-hole pairs out, allows electrons of the electron-hole pairs to be collected at the front electrode layer 14 and holes of the electron-hole pairs to be collected at the back electrode layer 24. Due to the presence of the heterojunction, the charge collection is about 100%. Thus, in certain embodiments, the particle detector 10, 100, 200, 300, 400 is self-biasing and does not require utilizing an externally applied bias. However, if desired, an external applied bias can be utilized. For example, an external reverse bias voltage can be applied to the semiconductor junction 18 to increase carrier collection and shorten the transport time for the carrier collection. In contrast to detectors having crystals or wafers of semiconductors of about 1 mm or more in thickness, the particle detector 10, 100, 200, 300, 400 described herein requires a reverse bias of only 1 to 10 volts to increase the internal field to about 10,000 V/cm.

The back electrode layer 24 is disposed over the semiconductor junction 18. In an embodiment, the back electrode layer 24 comprises gold, copper or another sufficiently conductive metal. The back electrode 24 has a thickness that is sufficiently thin that it permits charged particles, including protons, alpha particles, and tritons, with energies in the range from about 0.5 MeV to about 5 MeV to enter the semiconductor junction 18. Preferably, the thickness of the back electrode layer 24 is 20 nanometers (nm) or less. More preferably, the thickness of the back electrode layer 24 is between 2 and 20 nm. Even more preferably, the back electrode layer 24 comprises gold and has a thickness of between 10 to 15 nm.

A first electrical connection 26 is attached to the front electrode layer 14 and is in electrical communication therewith. A second electrical connection 28 is attached to the back electrode layer 24 and is in electrical communication therewith. The first electrical connection 26 and the second electrical connection 28 allows the signal produced by the particle detector 10, 100, 200, 300, 400 to be communicated and fed to another portion of the detector 10, 100, 200, 300, 400. The signal indicates that particles are in or have passed through the semiconductor junction.

In certain embodiments, the particle detector 10, 100, 200, 300, 400 is configured to detect neutrons. In these embodiments, a neutron activation layer 30 is disposed over the back electrode layer 24. Preferably, the neutron activation layer 30 is disposed directly on the back electrode layer 24. The neutron activation layer 30 can be deposited, printed, or painted over and on the back electrode layer 24. However, in certain embodiments, the neutron activation layer 30 comprises one or more sheets of neutron activation material separately prepared.

Figure 3:
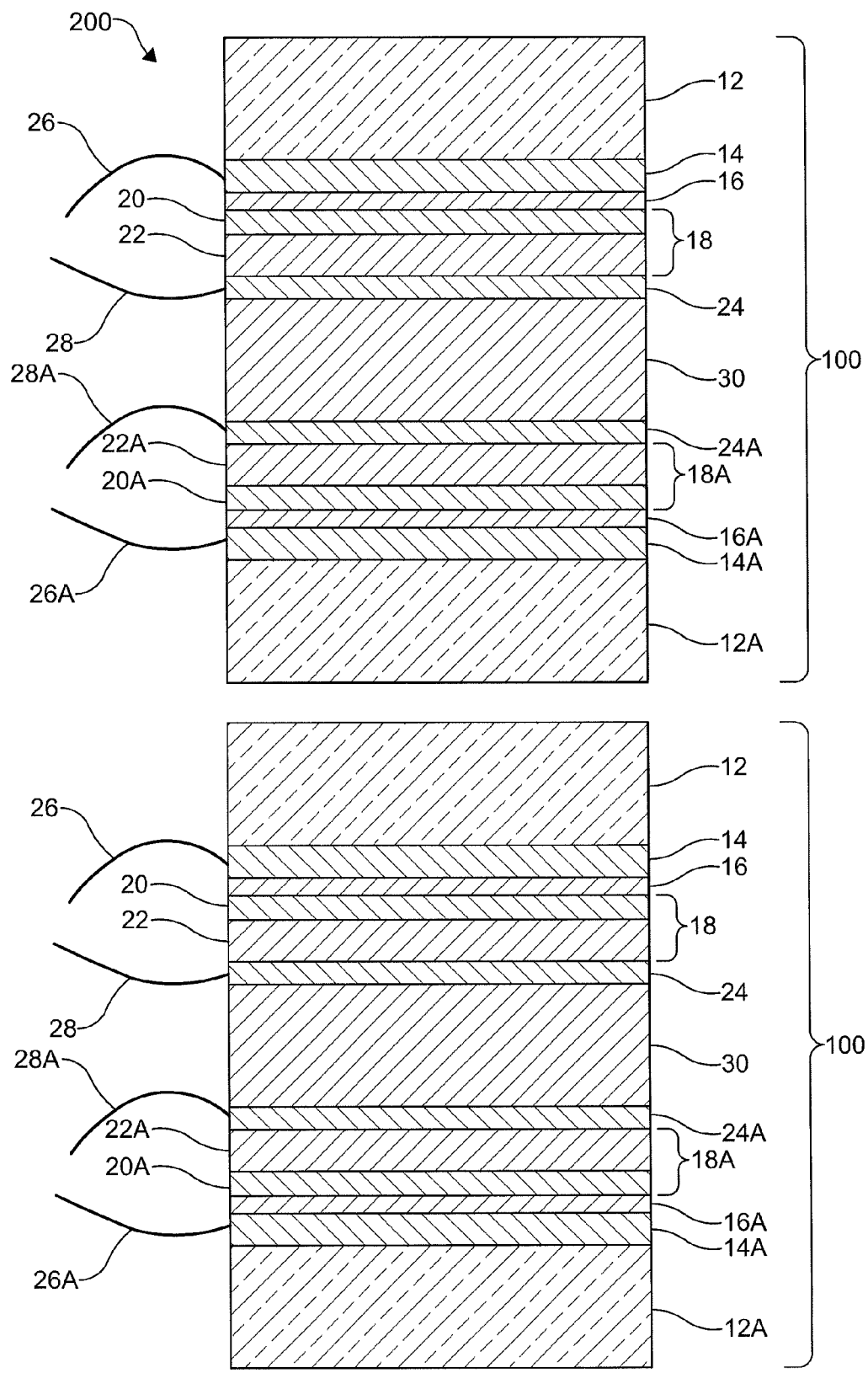
FIG. 3 is a cross-sectional view of another embodiment of a particle detector in accordance with the invention.

In certain embodiments like the one illustrated in FIG. 3, the particle detector 200 comprises two or more neutron activation layers 30. In this embodiment, the neutron activation layer(s) 30 may be affixed directly to one or more back electrode layers 24, 24A. Preferably, the total thickness of the neutron activation layer(s) 30 in the particle detector 10, 100, 200, 300, 400 is about 10 microns to about 250 microns. More preferably, the total thickness of the neutron activation layer(s) 30 in the particle detector 10, 100, 200, 300, 400 is 10 microns to 200 microns.

Preferably, each neutron activation layer 30 comprises a material which is an isotope with a high reaction cross-section for thermal neutrons. In one such embodiment, the layer of neutron activation material consists of an isotope with a high reaction cross-section for thermal neutrons. Preferably, in these and other embodiments, the neutron activation layer 30 comprises lithium-6 (Li-6), boron-10 (B-10), cadmium-113 (Cd-113), or another isotope with a high thermal neutron cross-section. Also, it is preferred that the lithium, boron, and cadmium are isotopically enriched, respectively, in the isotopes Li-6, B-10, Cd-113 when utilized in a neutron activation layer 30.

When provided adjacent a source of neutrons, thermal neutrons emitted from the source of neutrons pass into the particle detector 10, 100, 200, 300, 400. The thermal neutrons react with the neutron activation layer(s) 30 generating charged particles, alpha particles (He-4 nuclei) and tritons (H-3 nuclei), according to the following:

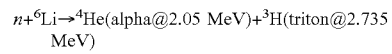

$$n + {}^6Li \rightarrow {}^4He(alpha@2.05\ MeV) + {}^3H(triton@2.735\ MeV)$$

In order to be detected, the alpha particles and tritons must exit the neutron activation layer 30. Also, upon exiting the neutron activation layer 30, the particles must have enough energy to create ionization in a semiconductor junction 18, 18A in order to be detected. The thickness of the neutron activation layer 30 can be selected to enable the particles to exit the neutron activation layer 30 and have enough energy to create ionization in a semiconductor junction 18, 18A. The thickness of the neutron activation layer 30 can also be selected to enable certain particles such as, for example, tritons to exit the neutron activation layer 30 and have enough energy to create ionization in a semiconductor junction 18, 18A and prevent the other particles such as, for example, alpha particles from exiting the neutron activation layer 30 and being detected. In one such embodiment where the neutron activation layer 30 comprises Li-6, the thickness of the neutron activation layer 30 is selected to be 10 microns or more. In another such embodiment where the neutron activation layer 30 is Li-6, the thickness of the neutron activation layer is selected to be 100 microns or more. In this embodiment, most alpha particles will lose all their energy and fail to emerge from the Li-6 neutron activation layer, but most tritons will emerge and about half of them will emerge in the direction of the semiconductor junction.

Figure 2:
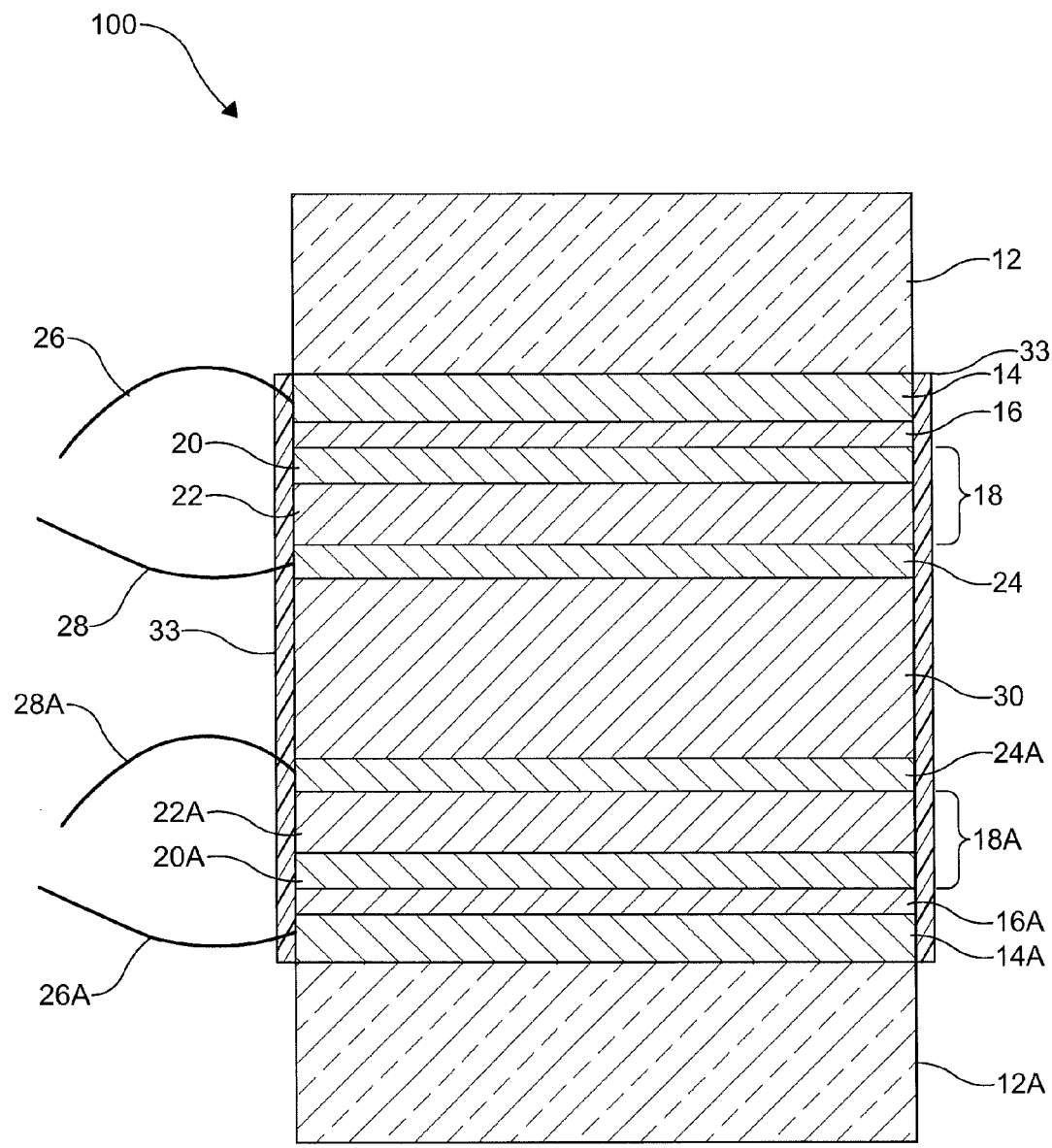
FIG. 2 is a cross-sectional view of another embodiment of a particle detector in accordance with the invention.

Furthermore, the thickness of the neutron activation layer 30 can also be selected to increase the probability that particles will emerge from the neutron activation layer 30 and have enough energy to create ionization in a semiconductor junction 18, 18A. For example, the known cross-section for thermal neutron absorption in a Li-6 neutron activation layer is 940 barns. This yields a neutron range in a pure Li-6 neutron activation layer of about 230 microns. If the Li-6 neutron activation layer is not isotopically enriched to 100%, the range will be greater since the Li-7 neutron cross-section is much smaller. To increase the number of neutrons detected, the thickness of the neutron activation layer 30 can be increased and two or more semiconductor junctions 18, 18A can be utilized in the particle detector 100, 200. In these embodiments, a neutron activation layer 30 is positioned between separate semiconductor junctions 18, 18A as is shown in FIGS. 2 and 3. Also, in these embodiments, the particle detector 100, 200 is oriented in the so called "back-to-back geometry."

More particularly, in the embodiment illustrated in FIG. 2, the particle detector 100 comprises the support member 12. The front electrode layer 14 is disposed over the support member 12. The semiconductor junction 18 having at least an n-type layer 20 and at least a p-type layer 22 is disposed over the front electrode layer 14. The back electrode layer 24 is disposed over the semiconductor junction 18. The neutron activation layer 30 is disposed over the first back electrode layer 24. A second back electrode layer 24A is disposed over the neutron activation layer 30. A second semiconductor junction 18A having at least an n-type layer 20A and at least a p-type layer 22A is disposed over the second back electrode layer 24A. A second front electrode layer 14A is disposed over the second semiconductor junction 18A and a second support member 12A is disposed over the second front electrode layer 14A. In this embodiment, the orientation of the n-type layer 20A and the p-type layer 22A of second semiconductor junction 18A is inverted in comparison to the orientation of the first semiconductor junction 18 so that the p-type layer 22A is disposed over or on the second back electrode layer 24A. Also, the first electrical connection 26 is attached to the front electrode layer 14 and is in electrical communication therewith and the second electrical connection 28 is attached to the back electrode layer 24 and is in electrical communication therewith as described above for the embodiment illustrated in FIG. 1. Additional electrical connections 26A, 28A are attached to and in electrical communication with the second front electrode layer 14A and the second back electrode layer 24A, respectively. The electrical connections 26, 26A, 28, 28A allow the signal produced by the particle detector 100 to be communicated and fed to another portion of the detector as described herein.

In the embodiment illustrated in FIG. 3, the particle detector 200 comprises two detectors 100 which are as described above for the embodiment illustrated in FIG. 2. In the embodiment illustrated in FIG. 3, the detectors 100 are oriented in the back-to-back geometry such that a second support member 12A of the first detector abuts a first support member 12 of the second detector. Also, in this embodiment, the particle detector 200 comprises two neutron activation layers 30. It should also be noted that one or more high resistivity buffer layers 16, 16A may be included in the embodiments of the particle detector 100, 200 illustrated in FIGS. 2 and 3 as is depicted therein and/or as described above.

In still further embodiments and as will be discussed below, embodiments of the particle detector may comprise more than two detectors 100 of the embodiment illustrated in FIG. 2 in order to increase the probability of detecting particles and/or enable nearly complete conversion of thermal neutrons into charged particles. The number of additional detectors 100 included in a particular embodiment of the particle detector may be selected based on the total combined thickness of the neutron activation layers and/or by the desired neutron absorption or scattering for the detector.

Figure 4:
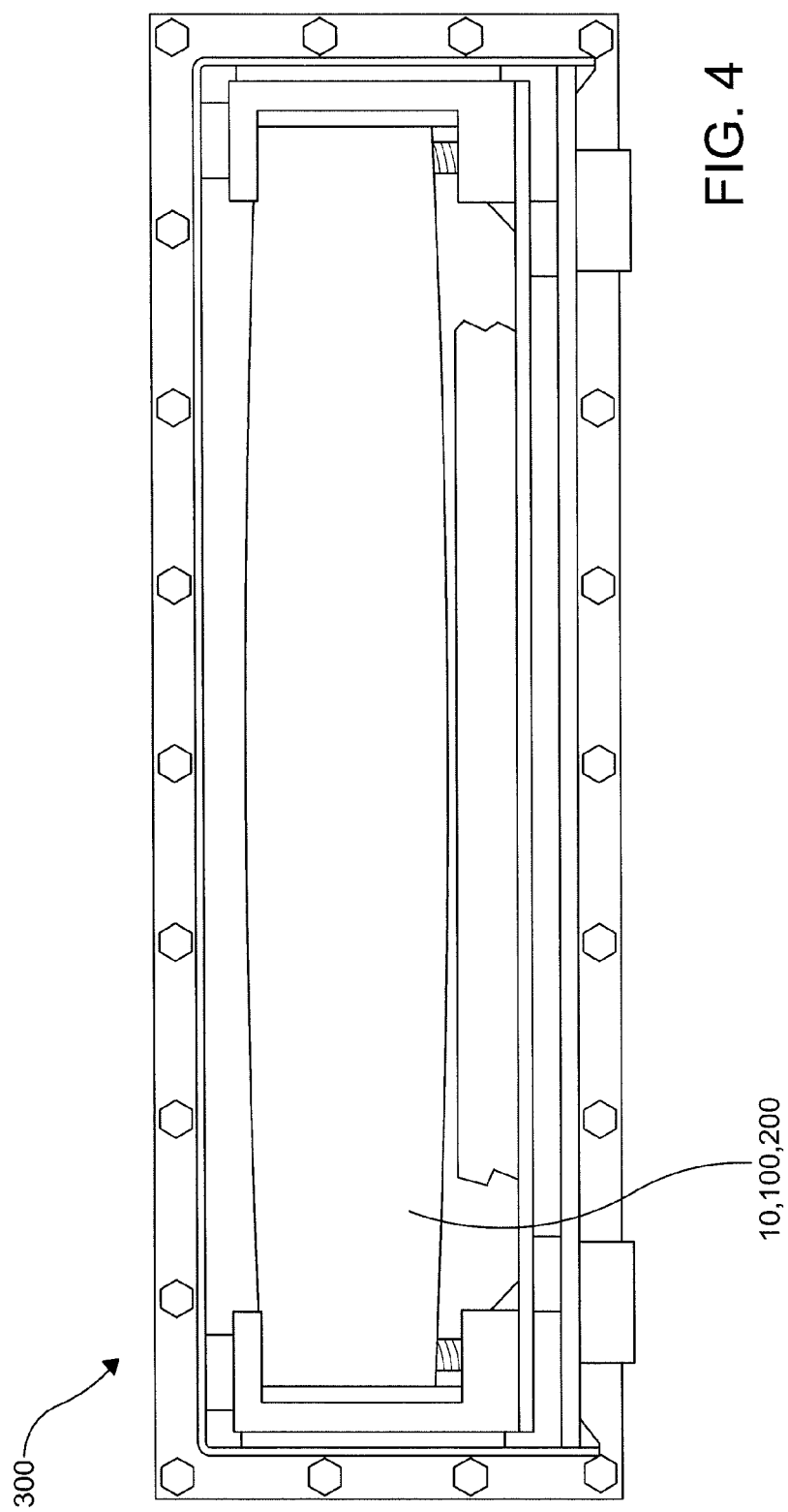
FIG. 4 is an end view of another embodiment of a particle detector in accordance with the invention.

It is preferable that certain portions of the particle detector 10, 100, 200 such as, for example, the semiconductor junction(s) 18, 18A and neutron activation layer(s) 30 described above are protected from environmental degradation. Thus, in certain embodiments such as the one shown in FIG. 4, the particle detector 300 comprises a sealed enclosure 32 which prevents the ingress of moisture, oxygen, and other environmental vapors and gases. In this embodiment, the enclosure 32 may be fabricated from materials that are substantially neutron transparent. In certain embodiments, the enclosure may comprise one or more encapsulation layers. For example, the enclosure may comprise one or more lamination layers. Preferably, one or more of the lamination layers is polymeric. Materials suitable for use in the lamination layer(s) include ethyl vinyl acetate (EVA), DuPont PV5400, polyvinyl butyral (PVB), and other like materials. It is preferred that the polymeric materials are provided with one or more inorganic barrier layers to further impede moisture ingress. Materials suitable for use in the one or more inorganic barrier layers are Al2O3, SiO2, and other inorganic materials that, when utilized with a polymeric material, impede moisture ingress. The enclosure may also include a front sheet and a back sheet. Materials suitable for use in the front sheet and back sheet include glass, stainless steel, Tedlar, and Tedlar containing sheets including TPT, TPE, TAT, TPAT, TPOT, and PAP. The front sheet and back sheet may also be chosen from PET or PEN-based materials.

Referring now to FIGS. 2 and 3, where if the support members 12, 12A comprise glass or metal, the support members 12, 12A provide hermetic barriers which help to create a suitable sealed enclosure. Further, in order to prevent the ingress of moisture into the particle detector 100, 200 in these embodiments, one or more edge seals 33 may be provided. The edge seal 33 extends from the first support member 12 to the second support member 12A and covers the exposed portions or the sides of the front electrode layers 14, 14A, high resistivity buffer layers 16, 16A, semiconductor junctions 18, 18A, back electrode layer 24, 24A, and neutron activation layer 18. Preferable materials for use in forming the edge seal include polybutyl, silicone, polyisobutylene (PIB) or another material capable of preventing the ingress of moisture, oxygen, and other environmental vapors and gases between the first support member 12 and the second support member 12A. It should be appreciated that while the edge seal 33 is shown for the embodiment illustrated in FIG. 2, one or more edge seals 33 may be provided in the embodiment of the particle detector 200 illustrated in FIG. 3 in the manner illustrated in FIG. 2 and described above.

When charged particles have entered or pass through the particle detector 10, 100, 200, 300, 400 ionization occurs. When ionization occurs, electron-hole pairs are formed in the semiconductor junction 18, 18A. The electron and hole of the electron-hole pair are separated by the electric field provided by the semiconductor junction 18, 18A and the signal is produced by the particle detector 10, 100, 200, 300, 400 which indicates that particles are in or have passed through the semiconductor junction 18, 18A. The signal can be of the pulsed variety. Also, it should be noted that each semiconductor junction 18, 18A may comprise an electric field that separates the electron-hole pairs and their respective electron and hole. The electrons and the holes of the electron-hole pairs are collected at the front electrode layer(s) 14, 14A and the back electrode layer(s) 24, 24A respectively, to provide the signal.

Figure 5:
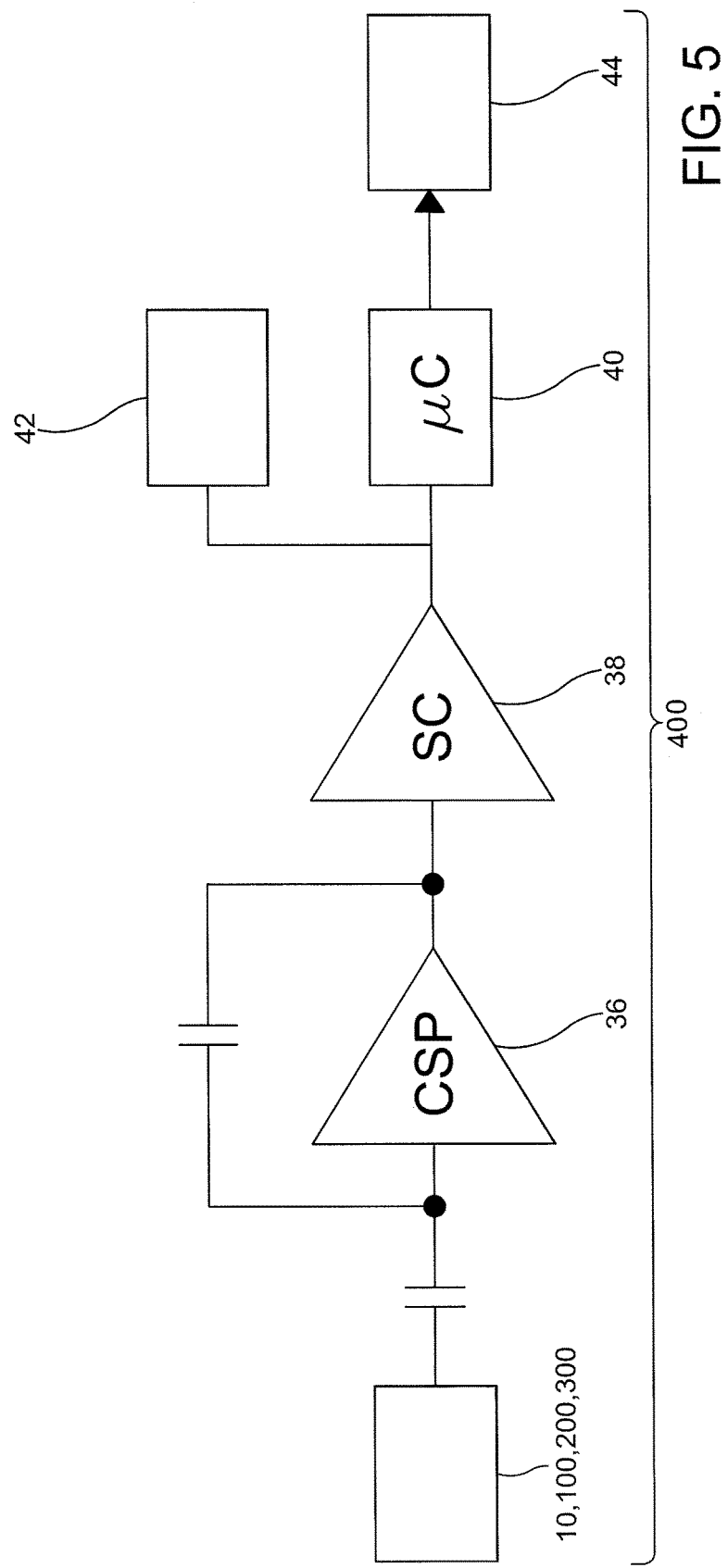
FIG. 5 is a schematic of an embodiment of the particle detector in accordance with the invention.
Figure 6:
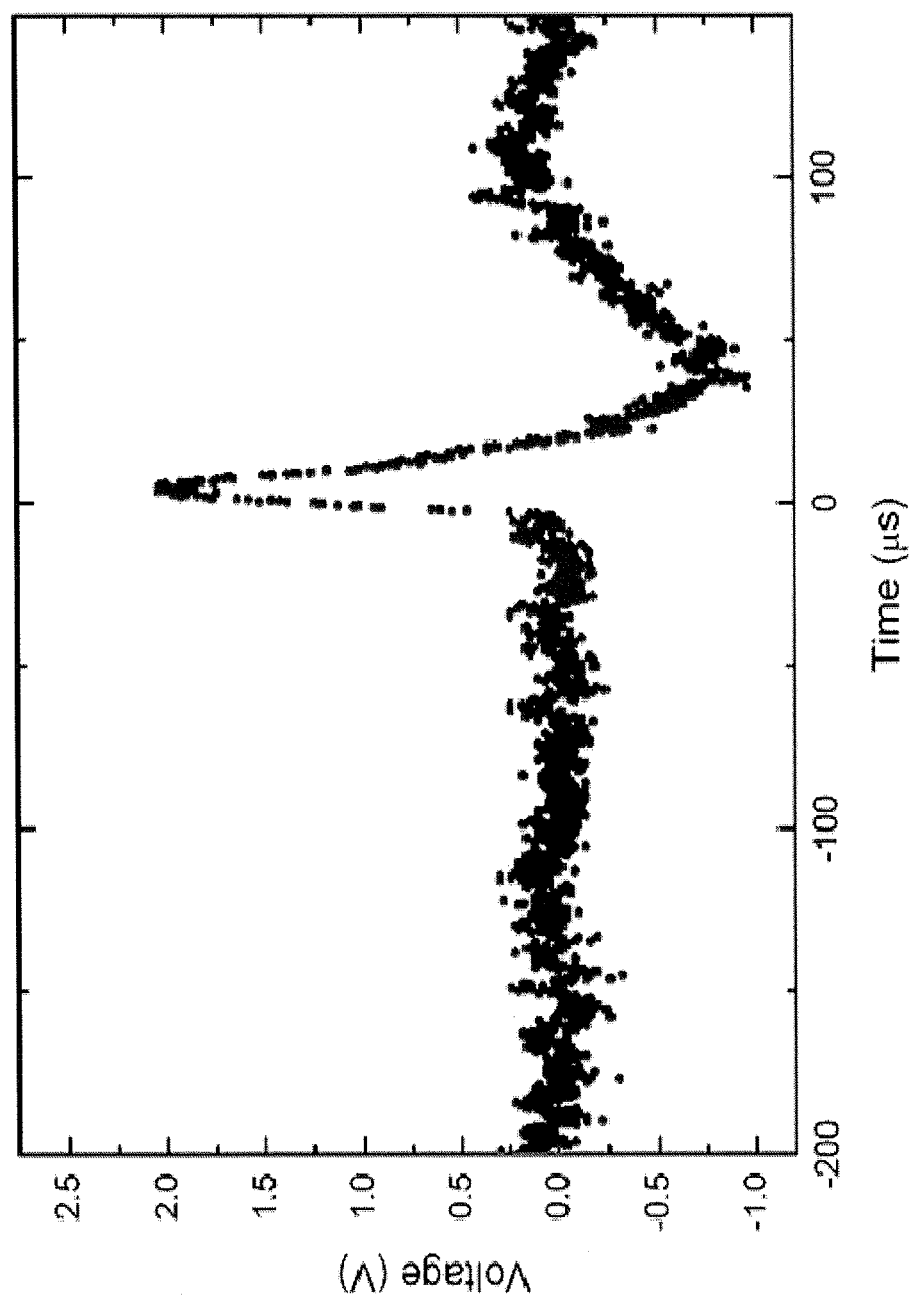
FIG. 6 is a graph of voltage versus time illustrating a representative signal output from the signal conditioner of FIG. 5 when being fed a pulsed signal from an embodiment of the particle detector in accordance with the invention.

Referring now to FIG. 5, in an embodiment, the particle detector 400 comprises a preamplifier 36 and signal conditioner 38. The preamplifier 36 may be in direct electrical contact with a portion of 10, 100, 200, 300 of the particle detector 400 and is preferably of the charge sensitive variety. The signal is fed into the input of the preamplifier 36. A microcontroller 40 receives the raw conditioned signal from the signal conditioner 38 and digitizes the signal. The microcontroller 40 also analyses the signal to algorithmically sort out false positives and spurious signal data. Utilizing the signal conditioner 38, the signal can amplified by a factor of 40,000 or more. The signal conditioner 38 also comprises one or more signal filters to reject signals produced from absorption of gamma and other types of radiation from being displayed with the pulsed signal indicating the presence of alpha particles, tritons, neutrons and/or other particles of interest that are detected. The one or more signal filters may be a discriminator. The discriminator may be of the low level variety or of the upper level variety. In these embodiments, the discriminator can be set to reject the signal produced by the absorption of gamma or another type of radiation by Cd-113 in the CdTe layer. From the signal conditioner 38, the signal can be sent to another amplifier 42 to increase signal strength and/or be multiplexed. The signal may also be sent to a display 44 such as a user interface or readout electronics. FIG. 6 depicts a graph of voltage versus time for the signal output from the signal conditioner 38 of FIG. 5 when being fed a pulsed signal from an embodiment of the particle detector 10 whose length × width (lateral size) is 0.5 cm². In this example, the particle detector 10 comprised a 2 micron CdTe layer. Also, the back electrode layer 24 was separated from a source of alpha particles (Am-241) by 5 mm.

As noted above, the particle detector 10, 100, 200, 300, 400 can be formed from materials that can be utilized with low cost manufacturing methods. In an embodiment, one or more of the front electrode layer 14, 14A, high resistivity buffer layer 16, 16A, semiconductor junction 18, 18A and back electrode layer 24, 24A are formed utilizing magnetron sputtering deposition. However, other deposition methods such as evaporation, vapor transport deposition, chemical bath deposition and chemical vapor deposition are suitable methods for use in forming one or more of those layers. Also, the support member 12, 12A can be provided as a ribbon or web and utilized in a roll-to-roll manufacturing process during formation the aforementioned portions of the particle detector.

The thickness and lateral size of the particle detector 10, 100, 200 can be selected to provide a balance between particle conversion, electron-hole pair generation, collection efficiency and/or detector capacitance. The signal can be utilized to select and maximize the lateral size of the particle detector 10, 100, 200 and improve the signal-to-noise ratio.

The lateral size of the particle detector 10, 100, 200 can be defined by scribing the layers and semiconductor junction(s) of the particle detector. Preferably, scribing is performed using a laser scribe or a mechanical scribe. The laser may comprise a finely focused laser beam. When a laser scribing system is utilized, a pattern of laser scribed lines can be formed through the layers and semiconductor junction(s) of the particle detector 10, 100, 200. The laser scribing system is utilized to form the laser scribed lines which provide electrical isolation between portions of the layers or portions of the semiconductor junction(s) or individual layers and/or semiconductor junction(s). Utilizing a laser scribing system, allows the particle detector 10, 100, 200 to be formed to have a lateral size which could be of a square millimeter size or several square meters in size.

In embodiments where a scribing process is utilized, the particle detector 200, 300, 400 may comprise two or more smaller detector subunits integrated on a single large area support member. In these embodiments, the particle detector may be non-imaging. Alternatively, the particle detector can be configured as an array to provide spatial sensitivity and imaging. In embodiments where the particle detector is imaging and spatially sensitive, several layers of arrays can be assembled to allow the detector data to be analyzed to determine the direction of the incoming particle or neutron. This feature can help to locate a source of particles such as, for example, SNM. In addition, spatial sensitivity may enable the particle detector to be utilized as a beam profiling instrument in a neutron reactor and in other high energy particle accelerator systems. In the imaging and non-imaging embodiments, the sensitivity of the particle detector can be selected to detect charged particles over large areas to achieve a low detection threshold and to discriminate against gamma radiation.

Figure 7:
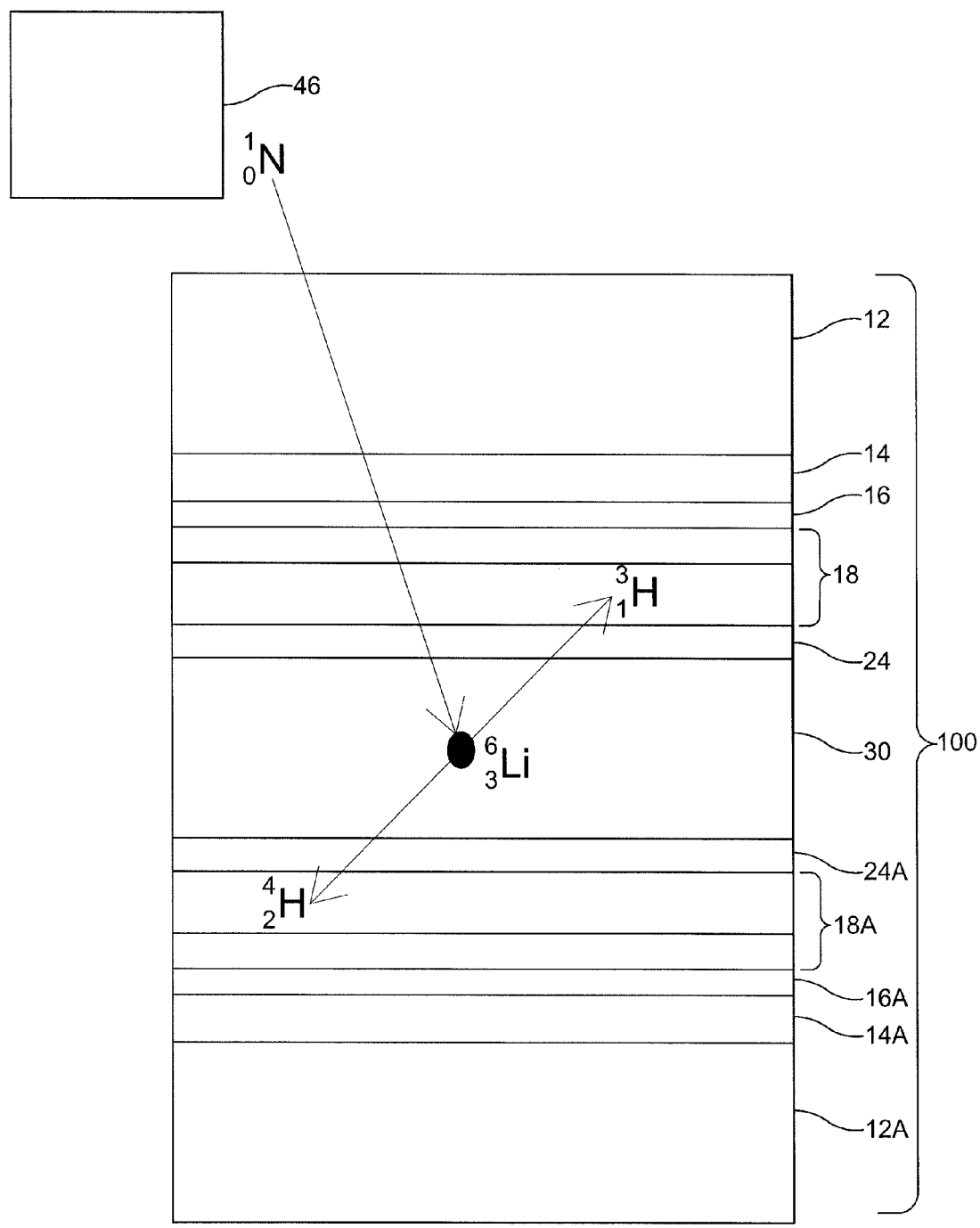
FIG. 7 illustrates portions an embodiment of a method of detecting particles in accordance with the invention.

The method of detecting particles will now be described below with reference to FIG. 7 and with respect to detecting neutrons. The method will be described with reference to the embodiment of the particle detector 100 illustrated in FIG. 2. It should be appreciated that the method of detecting particles would operate in a similar fashion when practiced with the other embodiments of the particle detector 10, 200, 300, 400 described above. It should also be appreciated that the method is applicable to detecting particles other than neutrons.

To detect neutrons, the particle detector 100 is provided adjacent a source of neutrons 46. The source of neutrons 46 may be a fissionable material such as plutonium-239, enriched uranium (U-235) or another neutron source. For the purpose of describing the method, the semiconductor junctions 18, 18A will be referred to as a heterojunction comprising a CdS layer and a CdTe layer. Also, for the purpose of describing the method, the neutron activation layer will be referred to as comprising Li-6. However, it should be appreciated that in other embodiments, the particle detector may have semiconductor junction and/or neutron activation layer comprising alternative materials.

As noted above, thermal neutrons react with the neutron activation layer 30 to generate alpha particles (He-4 nuclei) and tritons (H-3 nuclei) according to the following:

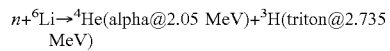

A neutron reacting with the neutron activation layer 30 is followed by an emission of an alpha particle and a triton. As is illustrated in FIG. 7, the alpha particle and triton are oppositely directed. Due to the typically low energy of the neutron(s), the particles are created with velocities in opposite directions (equal and opposite momenta). The particles leave the neutron activation layer and enter the CdTe layer of the semiconductor junctions 18, 18A. The oppositely directed emission of the alpha particle and triton creates ionization in the form of electron-hole pairs in the heterojunctions 18, 18A, more particularly the CdTe layers. Neutron absorption by the neutron activation layer 30 is indicated when one, or both, of the alpha particle and triton creates ionization in the heterojunctions 18, 18A. In order to be detected, the alpha particle and/or the triton must enter the CdTe layer with enough energy to create ionization. Also, as described above, the electron-hole pairs are separated into electrons and holes by the electric field provided by the heterojunction junctions 18, 18A and create a pulsed signal.

The charge and energy of a particle can be determined by the particle detector by appropriate selection of the thickness of the polycrystalline layers of CdS and CdTe. Further, as discussed above, the thickness of the Li-6 neutron activation layer affects the energy of a particle and whether the particle can create ionization in the CdS/CdTe heterojunction. For example, when the particle detector comprises a Li-6 neutron activation layer having a thickness of about 100 microns, most of the 2.05 MeV alpha particles generated will not emerge from the activation layer due to their energy loss rate being about 3.5 MeV/100 microns. However, the tritons generated have 2.74 MeV of energy and lose energy at a rate of about 0.53 MeV/100 microns of Li-6 neutron activation layer. Thus, most of the tritons will escape the neutron activation layer and pass through the back electrode layer for detection in the CdTe layer of the heterojunction. Since the thermal neutron 1/e range in pure Li-6 is about 230 microns, a particle detector having 3 Li-6 neutron activation layers, each with 100 micron thickness, will pass only 27% of the neutrons incident perpendicular to the neutron activation layers. As such, 73% of these neutrons will be converted into charged particles (alphas and tritons). It should be appreciated that the fraction converted into charged particles is higher for other angles of incidence.

In other embodiments, it may be desirable to select the thickness of the Li-6 neutron activation layer to be less than 100 microns to detect more alpha particles generated from the reaction between the neutrons and the neutron activation layer. In an embodiment, Li-6 neutron activation layer has a thickness of about 10 microns. This thickness of the Li-6 neutron activation layer greatly improves the escape probability of the alpha particle. For example, for a Li-6 neutron activation layer having a thickness of 10 microns, a 2 MeV alpha particle will lose about 0.7 MeV in traversing the full 10 micron thickness of the neutron activation layer and will still have enough energy to enter the semiconductor junction through the back electrode layer. For example, when the semiconductor junction is a CdS/CdTe heterojunction and the back electrode layer comprises gold and has a thickness of 20 nm, an alpha having about 1.3 MeV of energy remaining after emerging from the neutron activation layer would lose about 0.35 MeV every 2 microns of heterojunction thickness and would easily be detected.

Thus, utilizing the embodiment of the particle detector illustrated in FIG. 2 and an Li-6 neutron activation layer having a thickness of 10 micron, it becomes likely that both particles, the alpha particle and triton, would be detected. Since the alpha particle and triton travel in opposite directions, they would register in the opposing semiconductor junctions 18, 18A. This allows the charge response to be summed to provide a signal with a larger pulse height and facilitate improved gamma radiation discrimination. Since the range for thermal neutrons in an Li-6 neutron activation layer is 230 microns, conversion of 73% of normally incident neutrons will require that, in certain embodiments, the particle detector comprises a plurality of semiconductor junctions and a Li-6 neutron activation layer that separates each semiconductor junction from an adjacent semiconductor junction as is shown for the embodiments illustrated in FIGS. 2 and 3. In these embodiments, the total Li-6 neutron activation layer thickness may be 300 microns or less.

When a Li-6 neutron activation layer has a thickness of 10 microns, only about 4% of the neutrons will be detected for each Li-6 neutron activation layer provided in the particle detector. Thus, in certain embodiments like the one illustrated in FIG. 3, the particle detector may comprise a plurality of Li-6 neutron activation layers arranged between adjacent semiconductor junctions in order to detect as many incident neutrons as possible.

In one such embodiment, the particle detector may comprise 10 or more Li-6 neutron activation layers. Preferably, in this embodiment, the particle detector comprises 15 Li-6 neutron activation layers, with each layer having a thickness of 10 microns, so that the total Li-6 neutron activation layer thickness is 150 microns. This embodiment of the particle detector has very high neutron detection efficiency. However, for this embodiment, it is preferable that each support member included therein be sufficiently thin so as to be neutron transparent. Since the mean free path of a thermal neutron through a glass support member having a silica composition is approximately 9.3 cm, it is preferable that for this embodiment that the total support member thickness for the particle detector is about 6 mm or less to allow neutrons into the innermost Li-6 neutron activation layer. Thus, if in this embodiment 60 support members are provided, then it is preferable to utilize support members that each have a thickness of 100 microns or less. Suitable support members may be of a composition and thickness of, for example, Willow™ glass.

EXAMPLES

Examples within the scope of the invention are particle detectors Ex 1-Ex 3.

The following experimental conditions are applicable to particle detectors Ex 1 and Ex 2.

Particle detector Ex 1 and particle detector Ex 2 each comprised a support member having a soda-lime-silica glass composition. The thickness of the support member was 3.2 mm. A front electrode was formed on the support member. The front electrode layer comprised fluorine-doped tin oxide (FTO). A high resistivity buffer layer was formed on the front electrode layer. The high resistivity buffer layer comprised tin oxide (TO). The combined thickness of the front electrode layer and the high resistivity buffer layer was approximately 700 nm. The semiconductor junction was a heterojunction that included an n-type layer comprising CdS and a p-type layer comprising CdTe. The thickness of the n-type layer was approximately 80 nm and the thickness of the p-type layer was approximately 2 microns. A back electrode layer was formed on the semiconductor junction. The back electrode layer comprised gold and copper. The back electrode layer was formed by evaporating the material of the back electrode layer through a mask. The thickness of the back electrode layer was approximately 20 nm. Particle detector Ex 1 was of a 0.3 $cm^2$ area and particle detector Ex 2 was of a 1 $cm^2$ area.

A source of particles was provided. The source of particles comprised Am-241, which provided 5.5 MeV alpha particles. Particle detector Ex 1 and particle detector Ex 2 were each provided adjacent the source of particles. More particularly, the back electrode layer of particle detector Ex 1 and the back electrode layer of particle detector Ex 2 were each positioned within several millimeters of the source of particles. The alpha particles entered each particle detector and created ionization in their respective semiconductor junction. The ionization was in the form of electron-hole pairs. The electron-hole pairs were separated utilizing electric fields provided by each semiconductor junction. The electrons of the electron-hole pairs were collected at the front electrode layer and the holes of the electron-hole pairs were collected at the back electrode layer for the particle detector Ex 1 and the particle detector Ex 2. A pulsed signal was produced by the particle detector Ex 1 and the particle detector Ex 2. The pulsed signal for the particle detector Ex 1 was 20-25 mV. The pulsed signal for the particle detector Ex 2 was about 10 mV.

The pulsed signals produced by the particle detector Ex 1 and the particle detector Ex 2 were each fed into a preamplifier. The pulsed signals produced by the particle detector Ex 1 and the particle detector Ex 2 were each amplified by the preamplifier by a factor of 40,000 and fed into an oscilloscope.

The following experimental conditions are applicable to particle detector Ex 3. Particle detector Ex 3 was configured similarly to particle detectors Ex 1 and Ex 2. For Particle detector Ex 3, the thickness of the layer of CdTe was approximately 2 microns.

A source of particles was provided. The source of particles comprised Am-241, which provided 5.5 MeV alpha particles. The back electrode layer of was positioned within 5 mm of the source of particles. The alpha particles entered the particle detector Ex 3 and created ionization in the semiconductor junction as described above. A pulsed signal was produced by the particle detector Ex 3, which was fed into a preamplifier and an amplifier.

Figure 8:
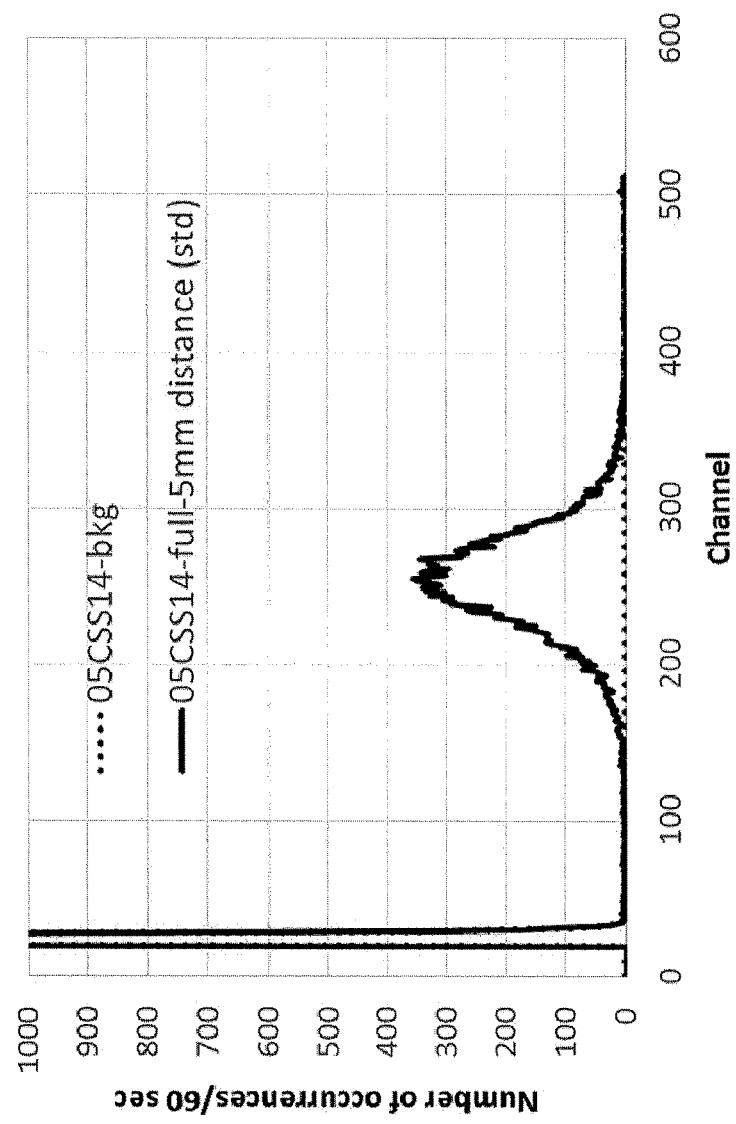
FIG. 8 is histogram depicting pulse-height distribution of 5.5 MeV alpha particles detected utilizing the embodiment of the particle detector of FIG. 1.

A histogram of the pulse height distribution of the particle detector Ex 3 is shown in FIG. 8. In FIG. 8, the pulse height distribution is proportional to channel number. Also, as is shown in FIG. 8, when the source of particles was removed (illustrated by the dotted line) the signal and a background signal is not detected.

The foregoing description is considered as illustrative only of the principles of the invention. Further, since numerous modifications and changes will readily occur to those skilled in the art, the invention may not be limited to the exact construction and processes shown and described herein. Accordingly, all suitable modifications and equivalents may be considered as falling within the scope of the invention.

What we claim is:

1. A particle detector, comprising:
a support member;
a front electrode layer disposed over the support member;
a semiconductor heterojunction having at least a polycrystalline n-type layer and at least a polycrystalline p-type layer, the semiconductor heterojunction disposed over the front electrode layer; and
a back electrode layer disposed over the semiconductor heterojunction having a thickness which is selected to permit particles having energies in the range from about 0.5 MeV to about 5 MeV to enter the semiconductor heterojunction.

2. The particle detector of claim 1, wherein the support member comprises glass, a polymer or a metal and has a thickness from 25 microns to 3000 microns.

3. The particle detector of claim 1, wherein the front electrode layer has a sheet resistance between 5 and 100 ohm/square and comprises at least one of ZnO:Al (AZO), $SnO_2$:F (FTO), $In_2O_3$:Sn (ITO), ZnS, CdO, $Cd_2CdO_4$, and InZrO (IZO).

4. The particle detector of claim 1, further comprising a high resistivity buffer layer disposed directly on the front electrode layer or the semiconductor heterojunction.

5. The particle detector of claim 4, wherein the high resistivity buffer layer has a sheet resistance of between 100 and 10,000 ohm/square and comprises at least one of ZnO (ZO), $SnO_2$ (TO), ZnS, CdO, and $Zn_2CdO_4$.

6. The particle detector of claim 4, wherein the high resistivity buffer layer and has a resistivity which is 1000 or more times greater than a resistivity of the front electrode layer.

7. The particle detector of claim 4, wherein the high resistivity buffer layer is disposed directly on the front electrode layer.

8. The particle detector of claim 1, wherein the polycrystalline n-type layer is CdS and the polycrystalline p-type layer is CdTe.

9. The particle detector of claim 1, further comprising an electric field which extends across the semiconductor heterojunction.

10. The particle detector of claim 1, further comprising a neutron activation layer disposed over the back electrode layer, wherein the neutron activation layer comprises a material which has a cross section that reacts with thermal neutrons.

11. The particle detector of claim 10, wherein the neutron activation layer comprises isotopically enriched lithium-6, boron-10, or Cd-113.

12. The particle detector of claim 10, wherein the neutron activation layer is a sheet of material having a thickness of 20 to 200 microns.

13. The particle detector of claim 1, further comprising a sealed enclosure that comprises materials which are substantially transparent to neutrons.

14. The particle detector of claim 13, wherein the sealed enclosure comprises a polymeric front lamination layer disposed over the front electrode layer and a polymeric back lamination layer disposed over the back electrode layer.

15. A particle detector for detecting neutrons, comprising:
a first support member;
a first front electrode layer disposed over the first support member;
a first semiconductor junction having a first polycrystalline n-type layer and a first polycrystalline p-type layer, wherein the first polycrystalline n-type layer is disposed over the first front electrode layer and the first polycrystalline p-type layer is disposed over the first n-type layer;
a first back electrode layer disposed over the first semiconductor junction;
a neutron activation layer disposed over the first back electrode layer;
a second back electrode layer disposed over the neutron activation layer;
a second semiconductor junction having a second polycrystalline n-type layer and a second polycrystalline p-type layer, wherein the second polycrystalline p-type layer is disposed over the second back electrode layer and the second polycrystalline n-type layer is disposed over the second p-type layer;
a second front electrode layer disposed over the second semiconductor junction; and
a second support member disposed over the second front electrode layer.

16. The particle detector of claim 15, wherein the neutron activation layer has a thickness of 20 to 200 microns and comprises isotopically enriched lithium-6, boron-10, or Cd-113.

17. The particle detector of claim 15, wherein a first electric field extends across the first semiconductor junction and a second electric field extends across the second semiconductor junction.

18. The particle detector of claim 15, wherein the first semiconductor junction and the second semiconductor junction each comprise a heterojunction of polycrystalline layers of CdS and CdTe.

19. The particle detector of claim 15, wherein the first back electrode layer and the second back electrode layer each have a thickness and the thicknesses are selected to permit particles having energies in the range from about 0.5 MeV to about 5 MeV to enter the first semiconductor junction and the second semiconductor junction, respectively.

20. A method of detecting particles comprising:
providing a source of particles;
providing a particle detector adjacent the source of particles, wherein the particle detector comprises a semiconductor heterojunction, front electrode layer, and back electrode layer, the semiconductor heterojunction being positioned between the front electrode layer and the back electrode layer and receiving particles from the source of particles, wherein the semiconductor heterojunction comprises a polycrystalline n-type layer and a polycrystalline p-type layer;
forming of electron-hole pairs in the semiconductor heterojunction; and
separating the electron-hole pairs utilizing an electric field provided by the semiconductor heterojunction;
collecting electrons of the electron-hole pairs at the front electrode layer and collecting holes of the electron-hole pairs at the back electrode layer; and producing a pulsed signal which indicates that particles are in or have passed through the semiconductor heterojunction.

21. The method of claim 20, wherein the source of particles provides energetic particles which are received as alpha particles (He-4 nuclei) and tritons (H-3 nuclei) in the semiconductor heterojunction.

22. The method of claim 20, wherein the source of particles provides neutrons.

23. The method of claim 22, wherein the particle detector further comprises a neutron activation layer that is disposed over the back electrode layer and the neutrons react with the neutron activation layer.

24. The method of claim 23, further comprising generating alpha particles (He-4 nuclei) and tritons (H-3 nuclei) and selecting the thickness of the neutron activation layer to allow the alpha particles and tritons to be of an energy which allows the electron-hole pairs to form in the semiconductor heterojunction.

25. The method of claim 20, wherein the semiconductor heterojunction is a first semiconductor heterojunction and the particle detector further comprises a second semiconductor heterojunction and a neutron activation layer, wherein the first semiconductor heterojunction and the second semiconductor heterojunction are separated from each other by the neutron activation layer and are oriented in a back-to-back configuration with respect to each other.

* * * * *